(12) United States Patent
Derderian

(10) Patent No.: US 9,754,792 B1
(45) Date of Patent: Sep. 5, 2017

(54) FIN CUTTING PROCESS FOR MANUFACTURING FINFET SEMICONDUCTOR DEVICES

(71) Applicant: GLOBALFOUNDRIES Inc., Grand Cayman (KY)

(72) Inventor: Garo Jacques Derderian, Saratoga Springs, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/056,513

(22) Filed: Feb. 29, 2016

(51) Int. Cl.
H01L 21/306 (2006.01)
H01L 21/308 (2006.01)

(52) U.S. Cl.
CPC .... *H01L 21/30604* (2013.01); *H01L 21/3085* (2013.01)

(58) Field of Classification Search
CPC .............. H01L 21/30604; H01L 21/3085
See application file for complete search history.

(56) References Cited

U.S. PATENT DOCUMENTS

2014/0273363 A1* 9/2014 Chiu .................. H01L 21/3086
438/165
2016/0351411 A1* 12/2016 Xie .................. H01L 21/30604

* cited by examiner

Primary Examiner — Duy Deo
(74) Attorney, Agent, or Firm — Amerson Law Firm, PLLC

(57) ABSTRACT

One illustrative method disclosed herein includes, among other things, forming an original fin-formation etch mask comprised of a plurality of original line-type features and removing at least a portion of at least one of the plurality of original line-type features so as to thereby define a modified fin-formation etch mask comprising the remaining portions of the plurality of original line-type features. The method also includes forming a conformal layer of material on the remaining portions of the plurality of original line-type features of the modified fin-formation etch mask and performing at least one etching process to remove at least portions of the conformal layer of material and to define a plurality of fin-formation trenches so as to thereby initially define a plurality of fins in the substrate.

20 Claims, 17 Drawing Sheets

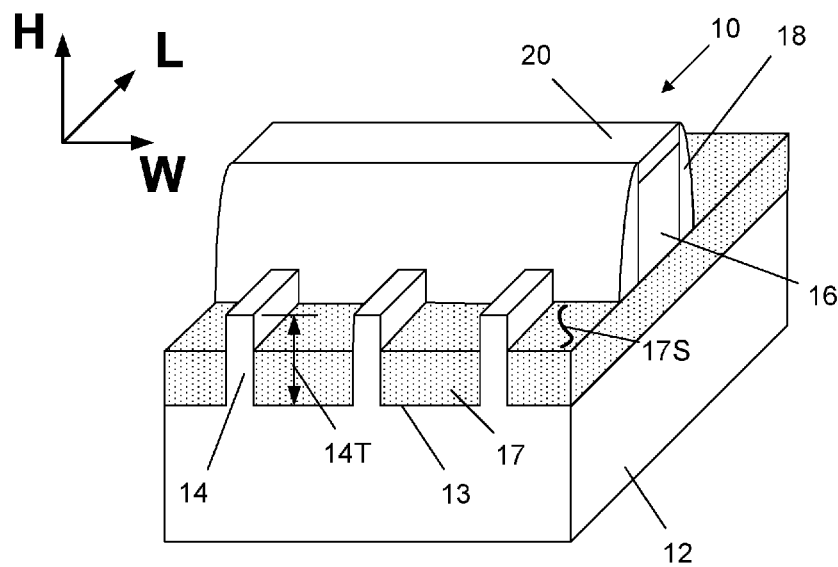
Figure 1A (Prior Art)
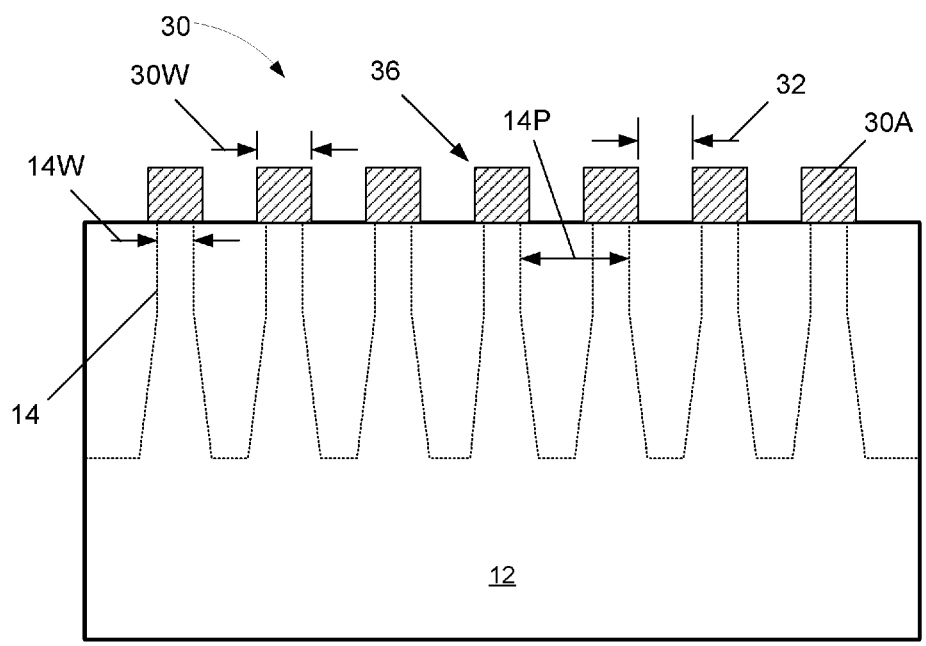
(Prior Art) Figure 1B

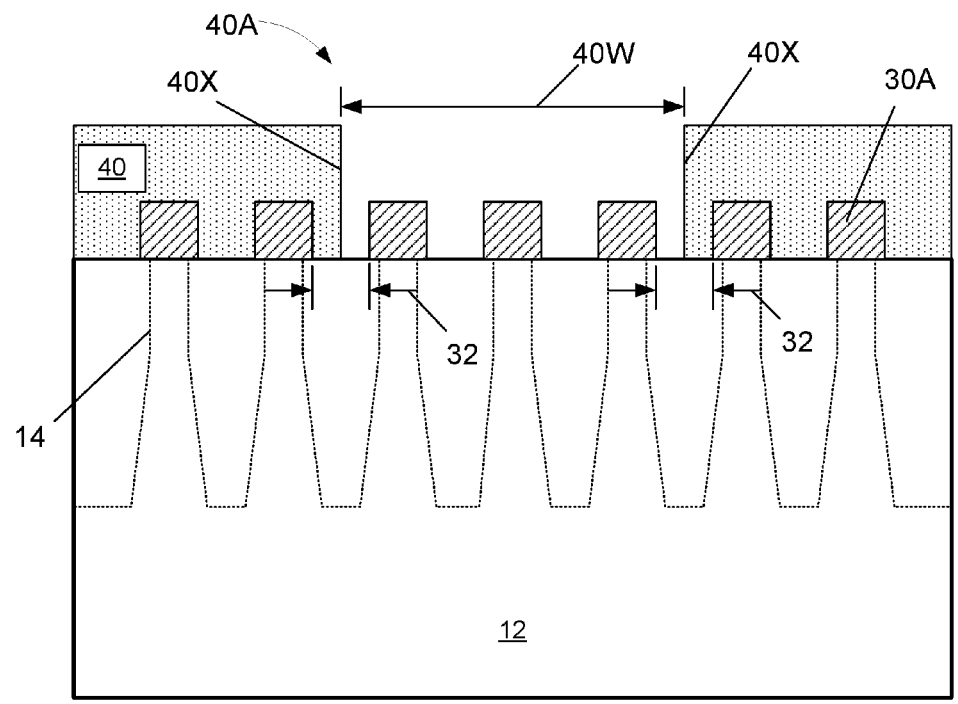
(Prior Art) Figure 1C
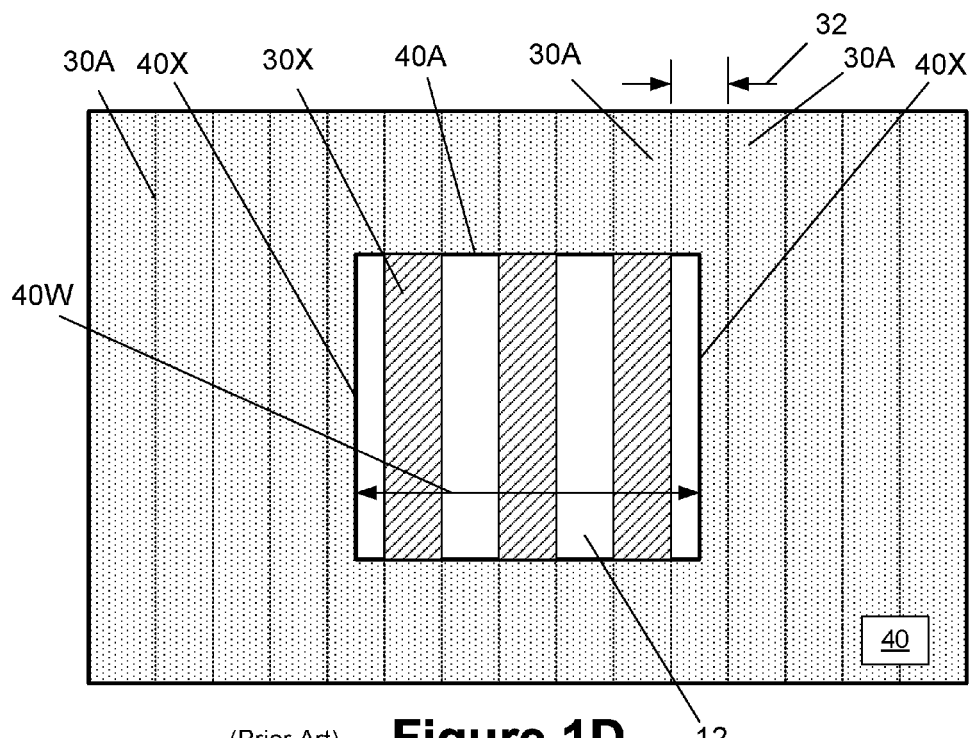
(Prior Art) Figure 1D

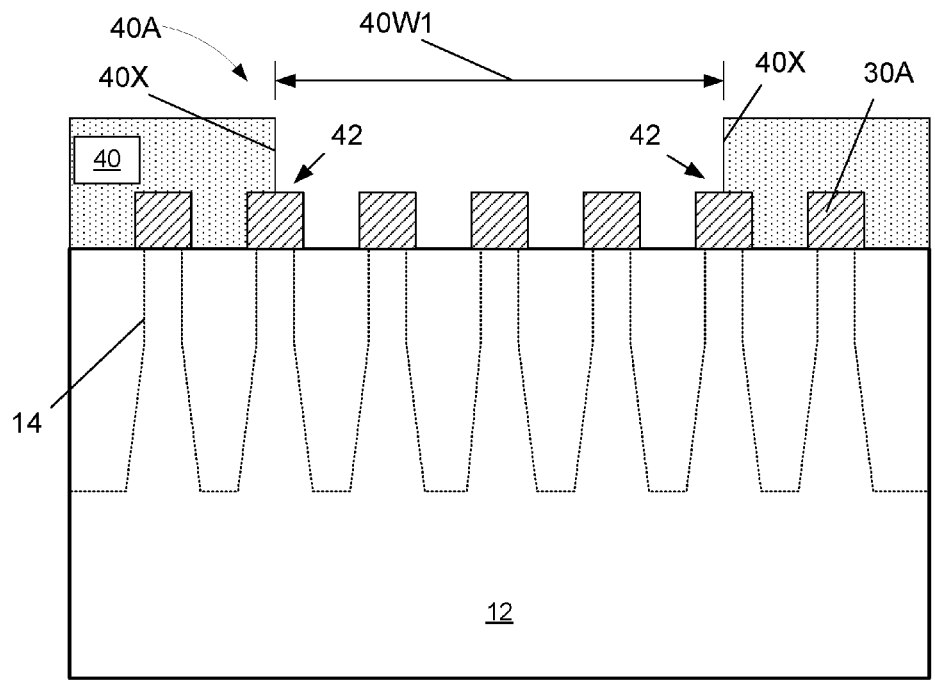
(Prior Art) Figure 1E
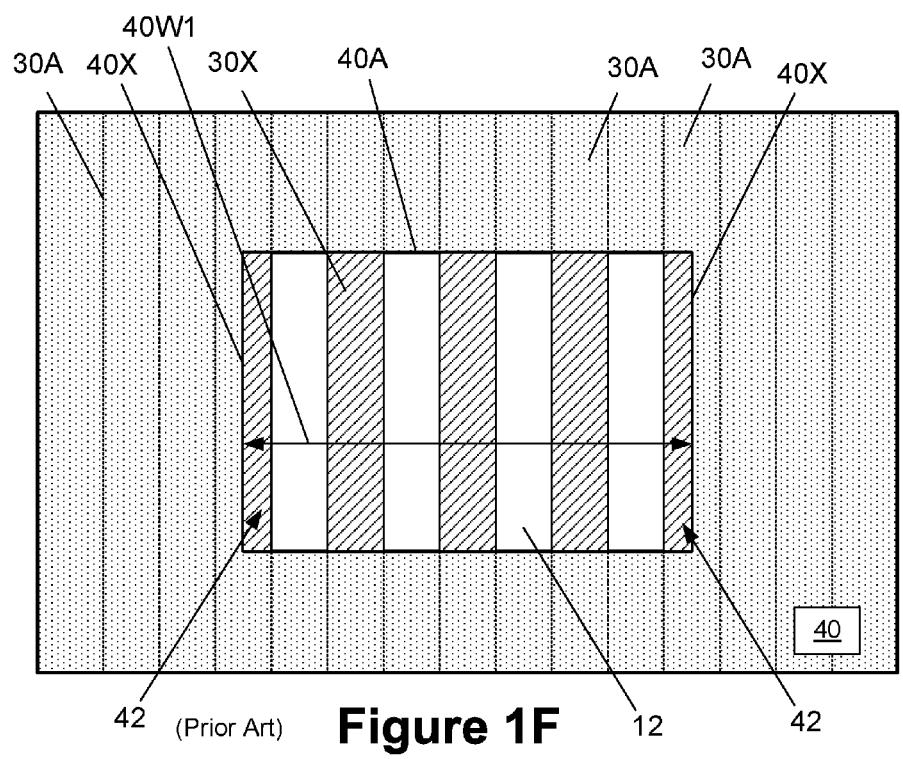
(Prior Art) Figure 1F

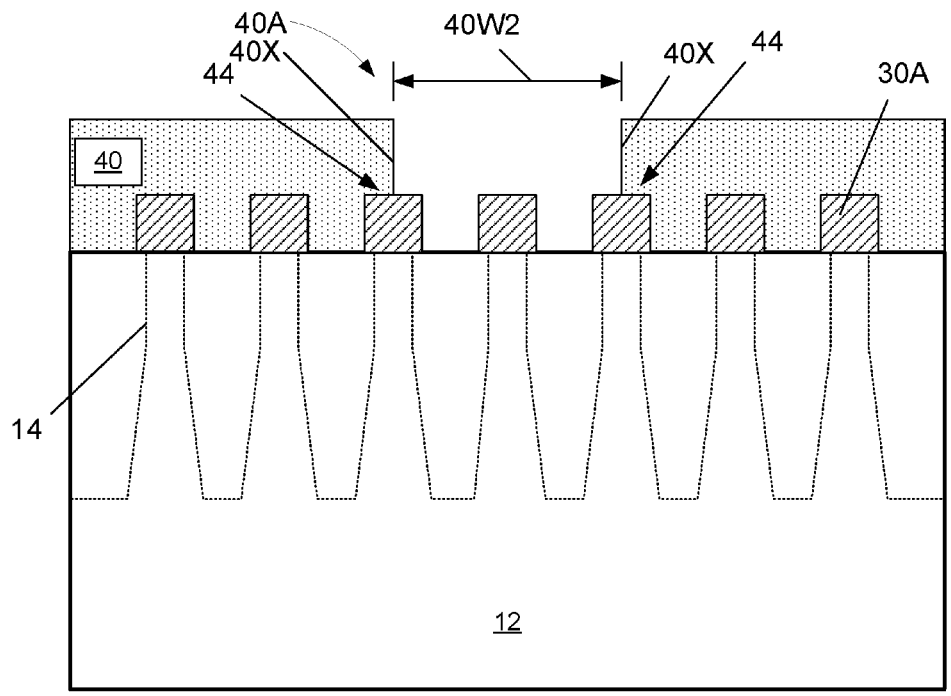
(Prior Art) Figure 1G
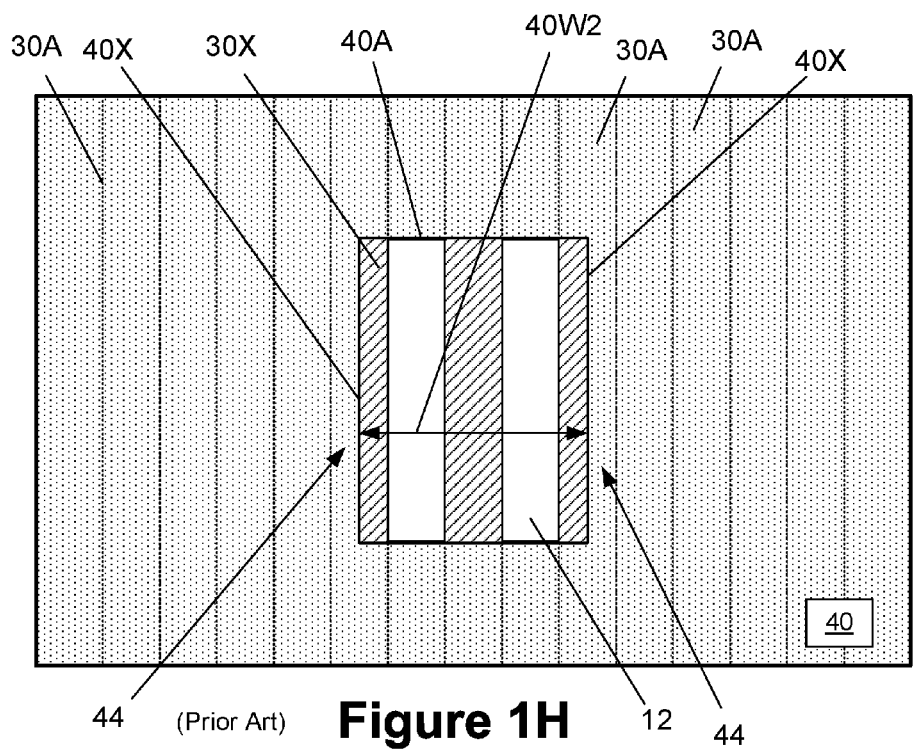
(Prior Art) Figure 1H

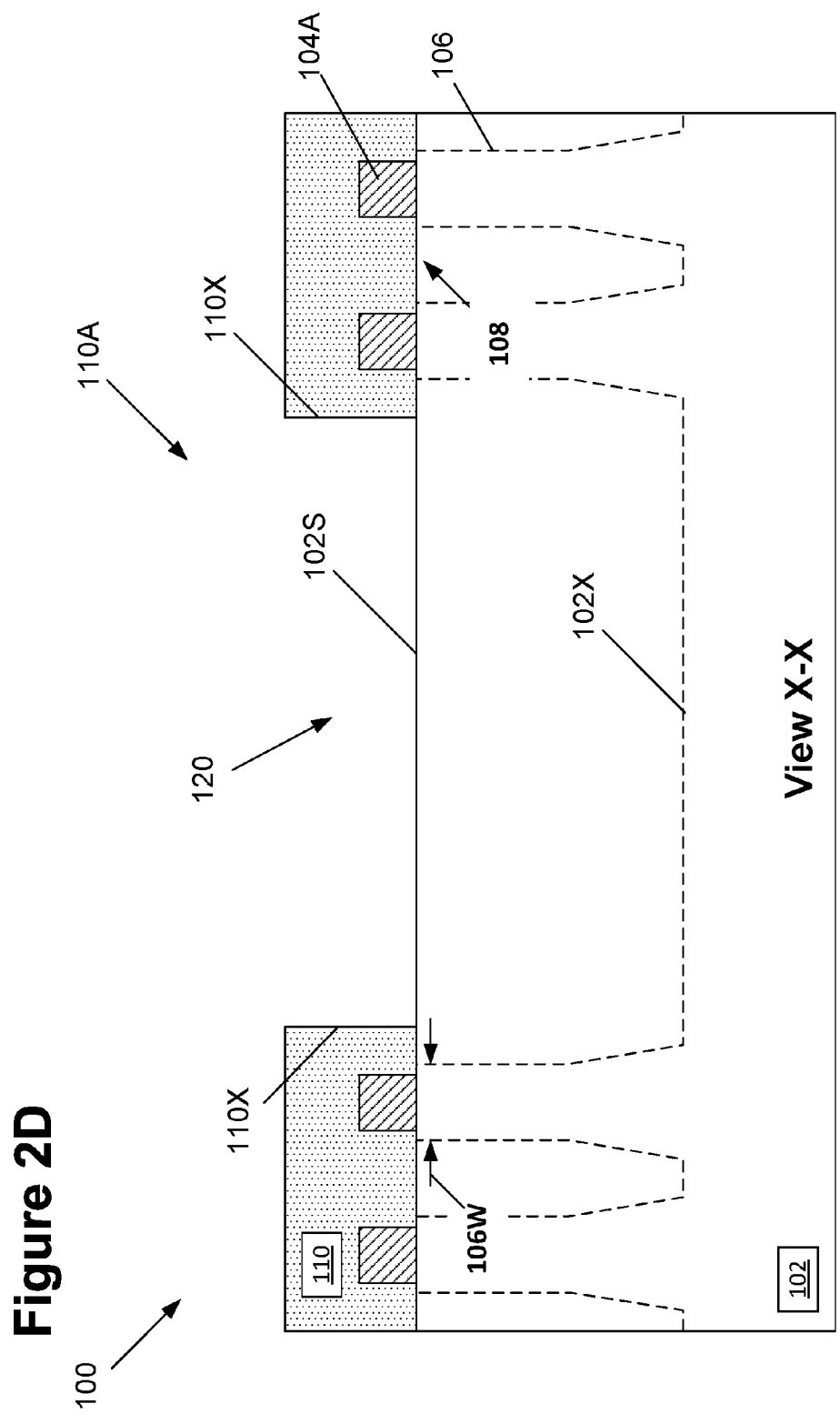

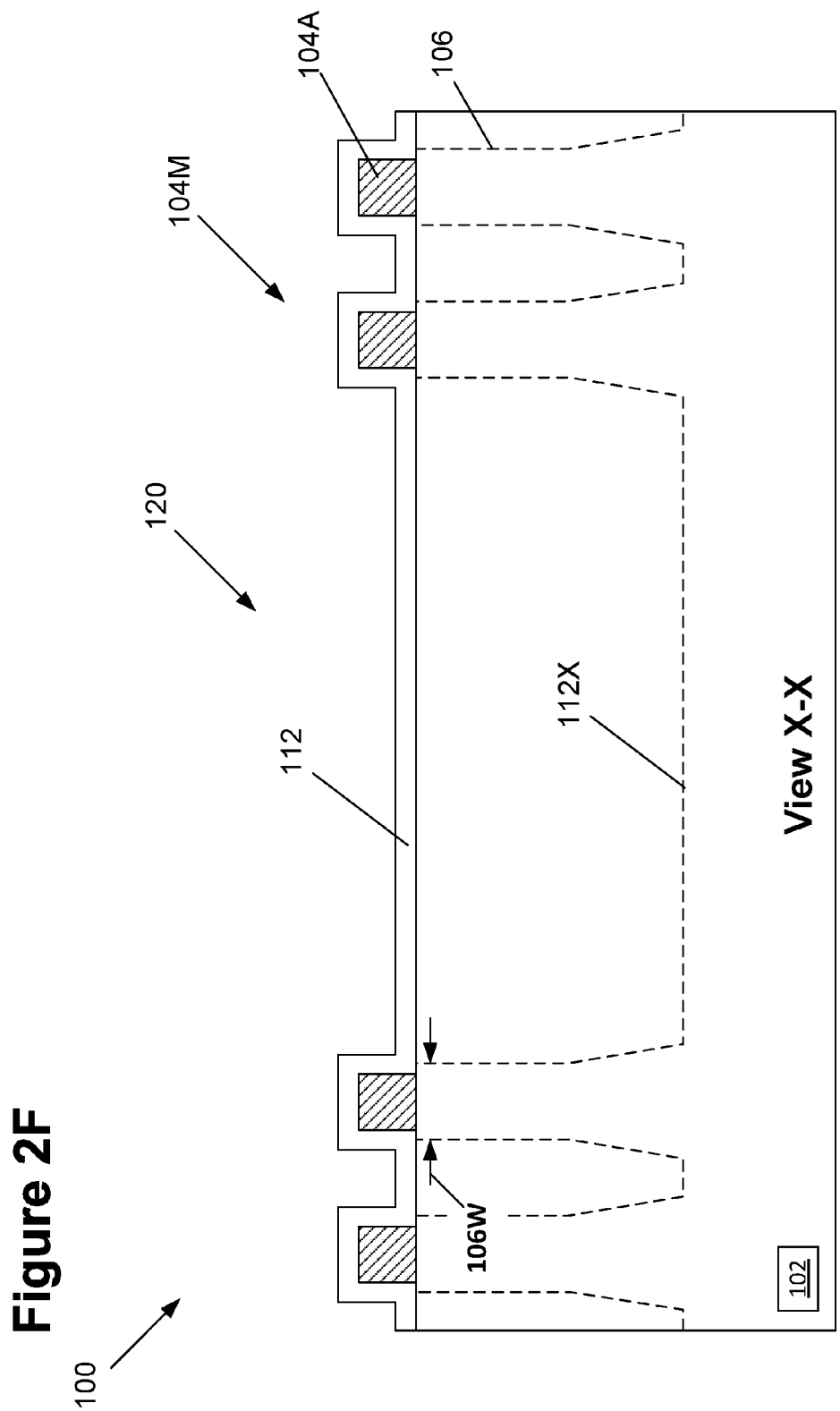

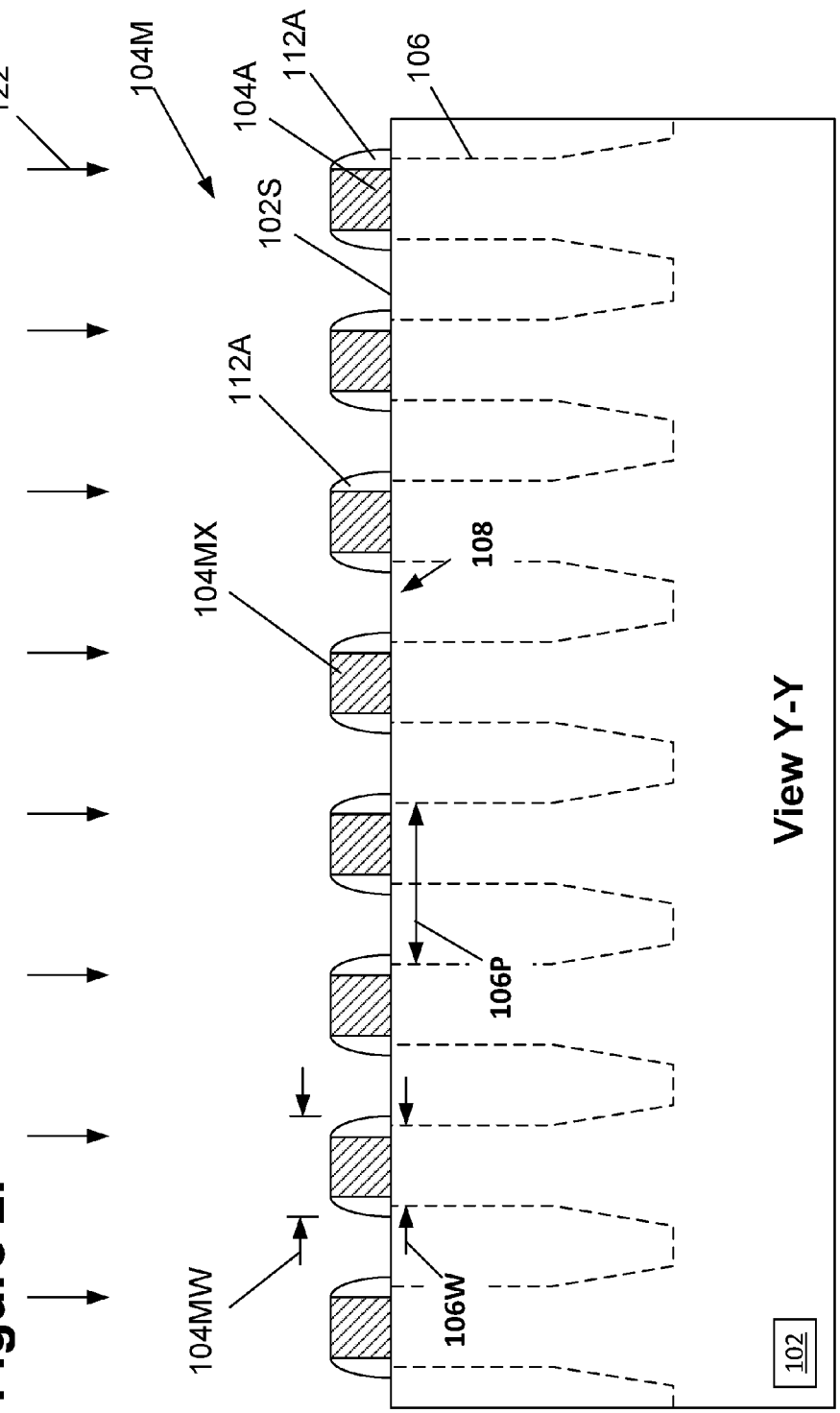

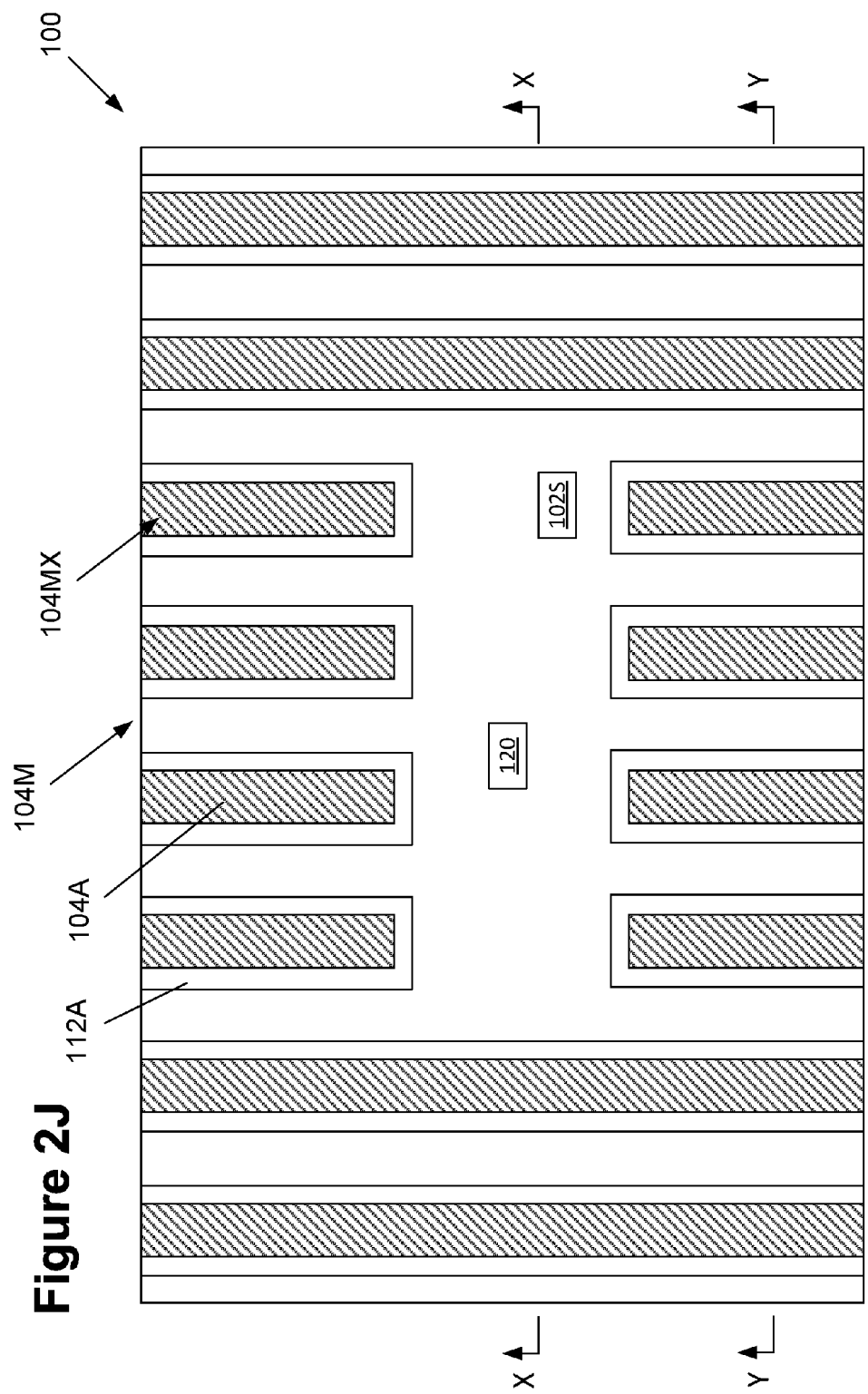

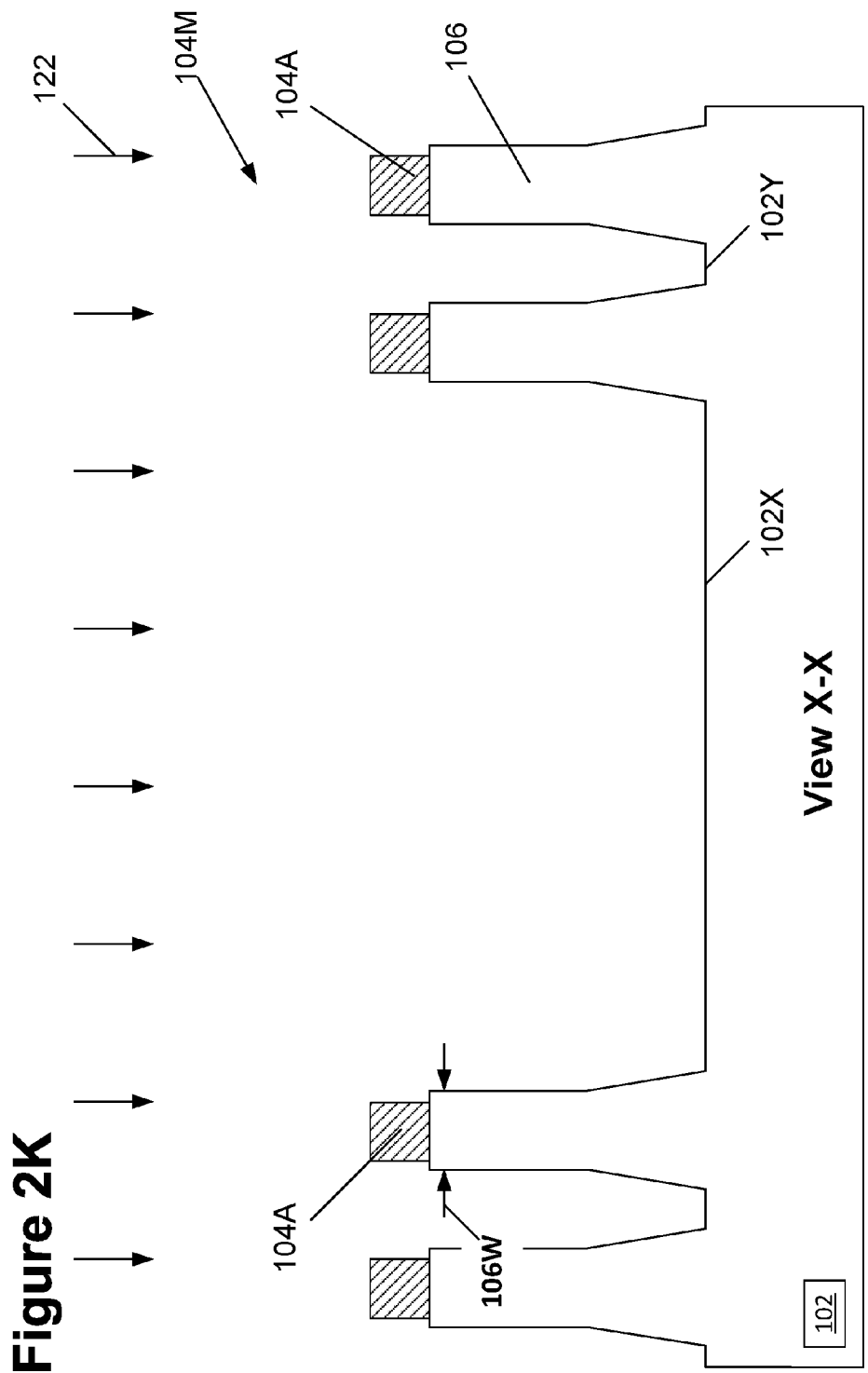

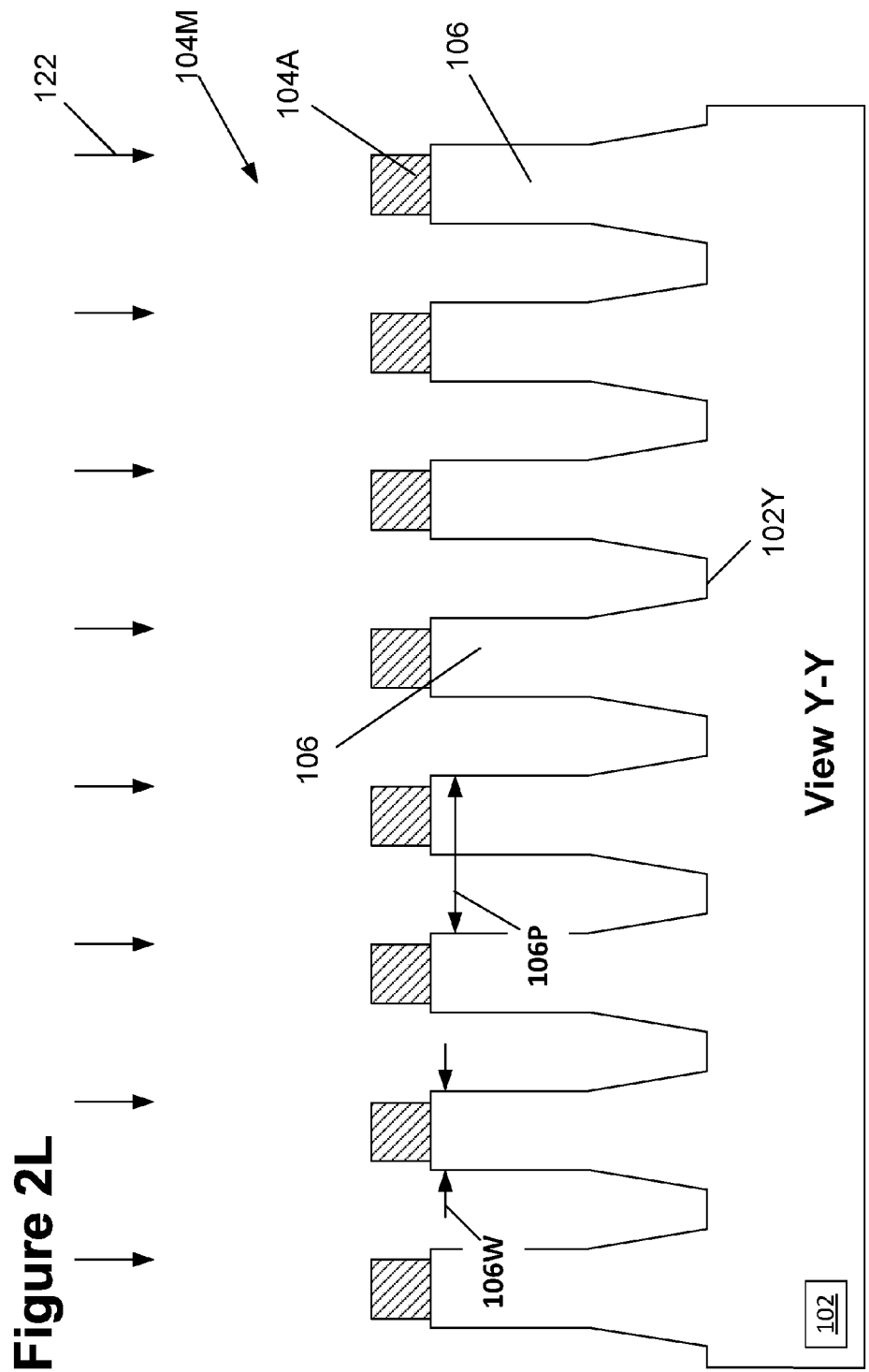

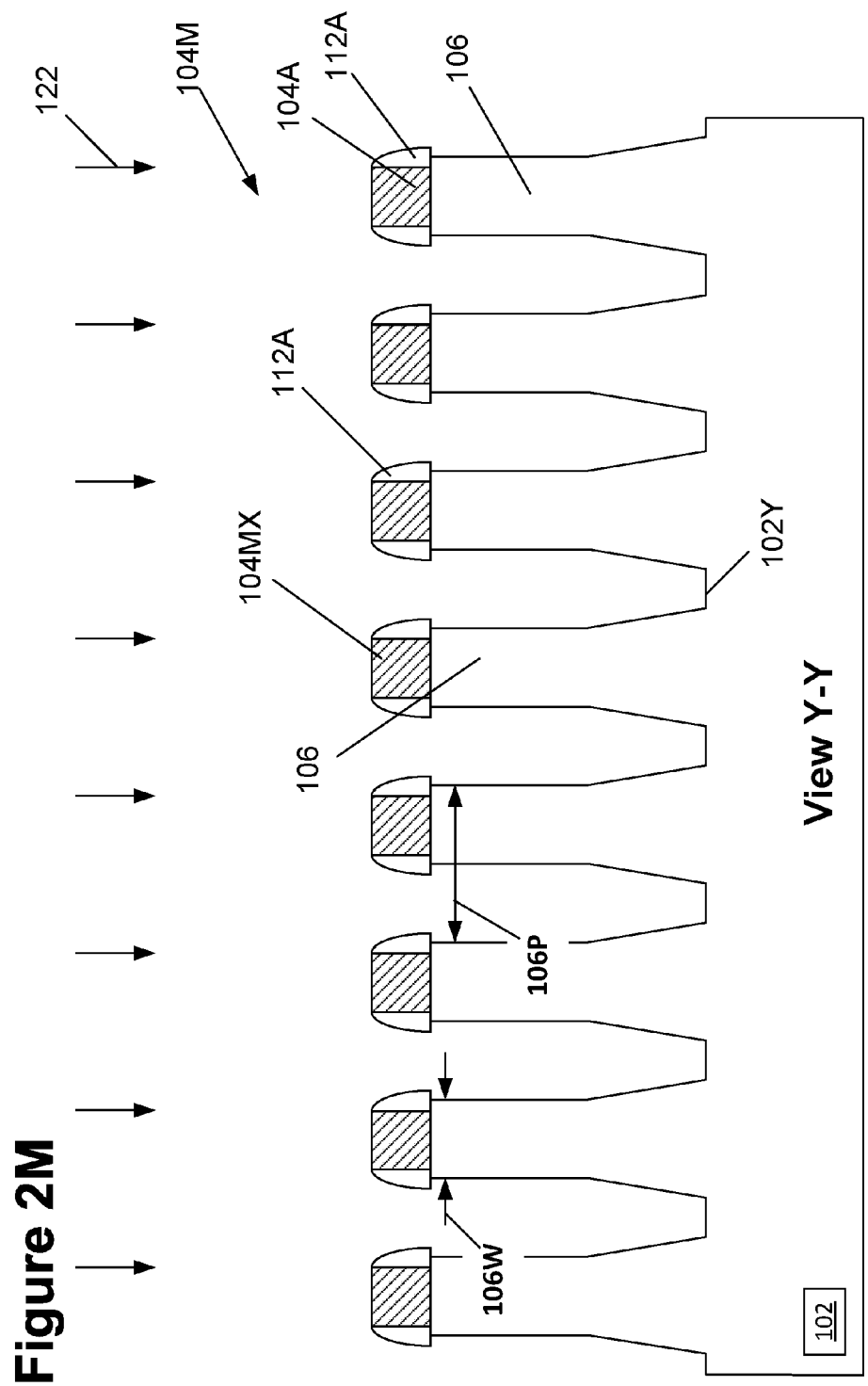

FIN CUTTING PROCESS FOR MANUFACTURING FINFET SEMICONDUCTOR DEVICES

BACKGROUND OF THE INVENTION

1. Field of the Invention

Generally, the present disclosure relates to the manufacturing of semiconductor devices, and, more specifically, to a novel fin cutting process for manufacturing FinFET semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. An insulating material 17 (with an upper surface 17S) provides electrical isolation between the fins 14. The gate structure 16 is typically comprised of a layer of gate insulating material (not separately shown), e.g., a layer of high-k insulating material or silicon dioxide, and one or more conductive material layers that serve as the gate electrode for the device 10. The fins 14 have a three dimensional configuration: a height H, a width W and an axial length L. The axial length L corresponds to the direction of current travel in the device 10 when it is operational, i.e., it corresponds to the gate length direction of the device. The portions of the fins 14 covered by the gate structure 16 are the channel regions of the FinFET device 10. The portions of the fins 14 that are positioned outside of the spacers 18 will become part of the source/drain regions of the device 10.

In the FinFET device 10, the gate structure 16 encloses both sides and the upper surface of the fins 14 to form a tri-gate structure so as to use a channel having a three-dimensional structure instead of a planar structure. In some cases, an insulating cap layer, e.g., silicon nitride, is positioned at the top of the fins 14 and the FinFET device only has a dual-gate structure (sidewalls only). Unlike a planar FET, a FinFET device typically exhibits the improved gate control, thereby reducing so-called short channel effects that occurred on planar devices with very small gate lengths. Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

As FinFET devices have been scaled to meet ever increasing performance and size requirements, the desired final lateral width of the fins 14 (near the top of the fin) has become very small, e.g., 6-12 nm, and the fin pitch has also been significantly decreased, e.g., the fin pitch may be on the order of about 30-60 nm. Moreover, after the fins 14 are initially formed, they will be subjected to various processing operations, e.g., cleaning, growth of thermal oxide material on the fins 14 that act to consume some of the lateral width (and height) of the initially formed fins. Accordingly, accurately defining these relatively small fin structures 14 while accounting for their subsequent reduction in size in post fin-formation processes can be challenging. One manufacturing technique that is employed in manufacturing FinFET devices is to initially form a patterned fin-formation etch mask layer (not shown) that is comprised of a plurality of spaced-apart line-type features (that correspond to the desired fins) above the substrate 12. Thereafter, one or more etching processes are performed though the patterned fin-formation etch mask layer to define the fin-formation trenches 13 in the substrate 12 that defines a regular array of multiple fins 14 that extend across the entire substrate 12. Using this type of manufacturing approach, better accuracy and repeatability may be achieved in forming the fins 14 to very small dimensions due to the more uniform environment in which the etching process that forms the fin-formation trenches 13 is performed.

However, when manufacturing FinFET devices, spaces for isolation structures must be provided between FinFET devices on the final integrated circuit product. One prior art processing technique that is performed to provide for these isolation spaces is sometimes referred to as a "Fin-Cut-Last" process. In the Fin-Cut-Last process, after the fin-formation trenches 13 have been formed so as to thereby define the regular array of fins 14 across the substrate 12, some portion or portions of several fins 14 are removed to create room for or define the spaces where isolation regions will ultimately be formed to separate the individual FinFET devices from one another.

Another prior art processing technique that is performed to form the spaces for the isolation structures is sometimes referred to as a "Fin-Cut-First" process. In general, the term "Fin-Cut-First" to describe the process is a bit of a misnomer in that, using this Fin-Cut-First technique, the portions of the "fins" to be removed are not actually formed in the substrate 12. Rather, in the Fin-Cut-First process, some portions of the line-type features in the patterned fin-formation etch mask layer are removed prior to performing the etching process that defines the fins 14 in the substrate 12. Accordingly, when the fin-formation etching process is performed through the modified patterned fin-formation etch mask layer (with some portions of the line type features removed) to define the fins 14, no fins 14 will form in the locations corresponding to the removed line-type features from the original patterned fin-formation etch mask layer. The spaces created where the fins 14 are not formed are the spaces where isolation regions will be formed.

However, as fin widths and fin pitches continue to decrease, the Fin-Cut-First process is becoming more challenging, as will be explained with reference to FIGS. 1B-1H. FIG. 1B depicts a product after an initial patterned fin-formation hard mask layer 30, e.g., a patterned layer of silicon nitride/silicon dioxide, was formed above the substrate 12 in accordance with the desired fin pattern and pitch. The patterned fin-formation hard mask layer 30 is comprised of a plurality of line-type features 30A that extend across the substrate 12 (the features 30A extend into and out of the plane of the drawing page). Also depicted in dashed lines are illustrative fins 14 that will eventually be formed in the substrate 12 by performing an etching process through the patterned fin-formation hard mask layer 30 after portions of some of the line-type features 30A have been removed.

Some problems with such a prior art Fin-Cut-First manufacturing technique are best explained with an illustrative numerical example. For example, the fins 14 may have a target width 14W (at the top of the fin) at this point in the process flow (with the understanding that the width 14W will be reduced in subsequent manufacturing operations) of about 16 nm, and they may be formed with a desired fin pitch 14P of 30 nm. The line-type features 30A are formed so as to have a lateral width 30W that is slightly larger (e.g., 18 nm) than the target width 14W of the fins 14 to account for the natural size reduction of the fin 14 when the fin-formation etching process is performed. As a result of these constraints, the lateral space 32 between adjacent line-type features 30A may be about 12 nm.

FIGS. 1C-1D depict the formation of a patterned etch mask layer 40, i.e., a so-called fin-cut mask, above the patterned fin-formation hard mask layer 30. The patterned etch mask 40 may be made of any desired materials and it may be formed using traditional photolithographic tools and techniques. The patterned etch mask 40 has an opening 40A that exposes portions 30X of three of the line-type features 30A that are to be removed from the patterned fin-formation hard mask layer 30 to define a modified fin-formation etch mask layer 30 (with the portions 30X removed). The opening 40A has a target lateral width 40W. Ultimately, an etching process will be performed through the modified fin-formation hard mask layer 30 to define the fins 14 in the substrate 12.

In the example depicted in FIGS. 1C-1D, the opening 40A is depicted as being formed precisely to its targeted width 40W and with its edges 40X being perfectly aligned and positioned in the middle of the 12 nm lateral space 32 between adjacent features 30A. Unfortunately, accurately and reliably forming the opening 40A to its target width 40X and/or locating the edges 40X of the opening 40A this precisely is very difficult to accomplish in practice. Given that the lateral space 32 is about 12 nm (in the example described), that means there is only a tolerance or process window of about plus-or-minus 6 nm when it comes to defining the width 40W of the opening 40A precisely and/or to accurately locating the edges 40X of the opening 40A at the proper location between adjacent features 30A. If the mask opening 40A is not properly sized and/or located, problems can result, as described more fully below.

In the example depicted in FIGS. 1E-1F, the opening 40A is depicted as being formed with a lateral width 40W1 that is greater than its targeted width 40W. As depicted, the over-sized opening 40A exposes portions 42 of certain line features 30A that, according to the design process, should not be removed. If the exposed portions 42 are removed, then the fins that should have been formed under these exposed and removed portions 42 will not be formed, or at least not to the desired targeted width 14W. In the example depicted in FIGS. 1G-1H, the opening 40A is depicted as being formed with a lateral width 40W2 that is less than its targeted width 40W. As depicted, the undersized opening 40A covers portions 44 of line features 30A that, according to the design process, should be removed. If the covered portions 44 are not removed, then fins or partial fins will be formed in areas where they should not be formed. Even if the opening 40A in the etch mask 40 is formed to exactly match the target width 40W, properly aligning such a perfectly-sized opening is still a very challenging task given the very small process window (e.g., +/−6 nm) that must be met.

The present disclosure is directed to a novel fin cutting process for manufacturing FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a novel fin cutting process for manufacturing FinFET semiconductor devices. One illustrative method disclosed herein includes, among other things, forming an original fin-formation etch mask above a semiconductor substrate, the original fin-formation etch mask layer comprising a plurality of original line-type features, and removing at least a portion of at least one of the plurality of original line-type features so as to thereby define a modified fin-formation etch mask comprising the remaining portions of the plurality of original line-type features. In this example, the method also includes forming a conformal layer of material on the remaining portions of the plurality of original line-type features of the modified fin-formation etch mask and performing at least one etching process to remove at least portions of the conformal layer of material and to define a plurality of fin-formation trenches so as to thereby initially define a plurality of fins in the substrate.

Another illustrative method disclosed herein includes, among other things, forming an original fin-formation etch mask comprised of a plurality of original line-type features, the original line-type features having a first lateral width that is less than a target lateral width at an upper surface of a plurality of fins to be formed in a substrate, and removing at least a portion of at least one of the plurality of original line-type features so as to thereby define a modified fin-formation etch mask comprising the remaining portions of the plurality of original line-type features. The method further includes performing at least one process operation to add a material to the sidewalls of the remaining portions of the plurality of original line-type features of the modified fin-formation etch mask so as to form a plurality of modified line-type features having a second lateral width that is greater than the first lateral width and to expose portions of the substrate and performing a substrate etching process through the plurality of modified line-type features to remove at least the exposed portions of the substrate and thereby define a plurality of fin-formation trenches in the substrate that initially define the plurality of fins in the substrate.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1H depict illustrative prior art methods of removing selected fin structures when forming FinFET semiconductor devices; and FIGS. 2A-2M depict various illustrative novel fin cutting processes disclosed herein for manufacturing FinFET semiconductor devices.

Figure 2A:
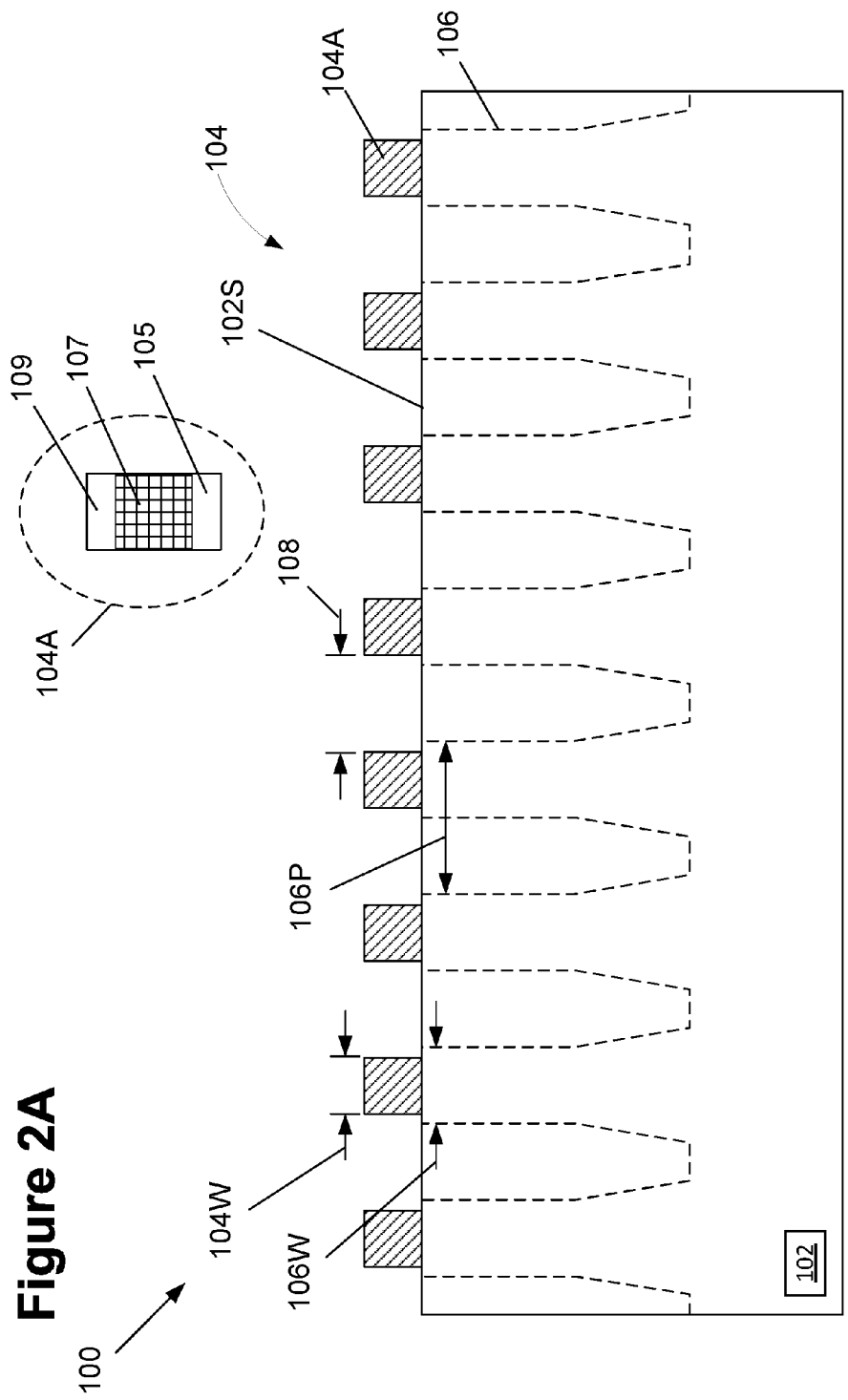

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various hybrid fin cutting processes for FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2A-2M depict various novel fin cutting processes disclosed herein for manufacturing FinFET semiconductor devices. As will be recognized by those skilled in the art after a complete reading of the present application, the illustrative FinFET device 100 described herein may be comprised of N-type FinFET devices, P-type FinFET devices or any combinations of such N- and P-type devices. The FinFET device 100 depicted herein will be formed above a semiconductor substrate 102 comprised of a semiconductor material, such as, for example, a bulk silicon substrate. The device 100 may also be formed on so-called SOI (semiconductor-on-insulator) substrates, wherein the material 102 would be the active layer of such an SOI substrate. Additionally, the material 102 may be comprised of any semiconductor material, e.g., silicon, silicon-germanium, germanium, a combination of so-called III-V materials, etc. Thus, the terms "substrate," "semiconductor substrate" or "semiconducting substrate" should be understood to cover all semiconductor materials in whatever physical form.

FIG. 2A depicts the device 100 after an initial patterned fin-formation etch mask layer 104, e.g., a patterned hard mask layer, was formed above the substrate 102. The initial patterned fin-formation etch mask layer 104 is comprised of a plurality of line-type features 104A that extend across the upper surface 102S of the substrate 102 (i.e., into and out of the drawing plane of FIG. 2A). The materials of construction for the patterned fin-formation etch mask layer 104 may vary depending upon the particular application as it may be comprised of a variety of materials, such as, for example, a photoresist material, silicon nitride, silicon oxynitride, etc. Moreover, the initial patterned fin-formation masking layer 104 may be comprised of multiple layers of material, such as, for example, a stack of materials comprising a silicon dioxide layer 105 (e.g., pad oxide), a silicon nitride layer 107 (e.g., pad nitride) and a protective layer of silicon dioxide 109, as depicted in the illustrative line-type feature 104A depicted within the dashed-line oval in FIG. 2A. The patterned fin-formation etch mask layer 104 may be formed by depositing the layer(s) of material that comprise the masking layer 104 and thereafter directly patterning the masking layer 104 using known photolithography and etching techniques. Alternatively, the patterned fin-formation etch mask layer 104 may be formed by using known sidewall image transfer techniques. Thus, the particular form and composition of the patterned fin-formation etch mask layer 104 and the manner in which it is made should not be considered a limitation of the present invention.

With continuing reference to FIG. 2A, a plurality of fins 106 (shown in dashed lines) will eventually be formed in the substrate 102. The fins 106 will be formed with a desired target lateral width 106W at the top of the fins 106 at the point in time when the fins 106 are initially formed in the substrate 102. The fins 106 will be formed so as to have a targeted fin pitch 106P. Of course, as discussed above, after the fins 106 are initially formed, they will be subjected to various processing operations, e.g., cleaning processes, the growth of thermal oxide material on the fins 106 that will act to consume some of the lateral width 106W of the initially formed fins 106. By way of example only, in one illustrative embodiment, the target initial lateral width 106W of the initial fins 106 may be on the order of about 16 nm, while the final lateral width of the fins 106 (at the top of the fins 106) after the FinFET device is completed may be on the order of about 6-12 nm. Additionally, in one illustrative embodiment, the fin pitch 106P may be on the order of about 30-60 nm. However, as will be appreciated by those skilled in the art after a complete reading of the present application, the illustrative numerical examples and ranges discussed herein are not to be considered to be limitations of the inventions disclosed herein, as the invention disclosed herein may be used in manufacturing FinFET devices as device dimensions continue to shrink.

Still referring to FIG. 2A, the line-type features 104A have a lateral width 104W. Unlike the prior art technique discussed in the background section of this application, the lateral width 104W of the features 104A is intentionally selected to be less than the target initial lateral width 106W of the initial fins 106. For example, depending upon the particular application, the lateral width 104W of the features 104A may be on the order of about 5-75% of the target initial lateral width 106W of the initial fins 106 at the time the fins 106 are initially formed. As depicted, there is a lateral space 108 between adjacent line-type features 104A of the patterned fin-formation etch mask layer 104. However, as a result of intentionally making the features 104A with a lateral width 104W that is less than the target initial lateral width 106W of the initial fins 106, the lateral space 108 between adjacent features 104A is larger than the corresponding lateral space 32 between the adjacent features 30A on the fin-formation etch mask layer 30 described in the background section of this application. The absolute magnitude of the lateral spacing 108 may vary depending upon the particular application and a variety of factors. However, as one numerical example, the target initial lateral width 106W of the initial fins 106 may be about 16 nm, the fin pitch 106P may be about 30 nm, and the lateral width 104W of the features 104A may be about 12 nm. Based upon these illustrative examples, the lateral spacing 108 will be on the order of about 18 nm (30 nm-12 nm), which is significantly larger, e.g., 1.5 times larger, than the 12 nm spacing 32 between the adjacent features 30A on the patterned fin-formation etch mask 30 discussed in the background section of this application. Thus, as will be discussed more fully below, using the methods described herein, there is a larger process window for accurately forming and locating the fin-cut etch mask layer (not shown in FIG. 2A) that will eventually be formed above the substrate 102, as described more fully below, thereby eliminating or at least reducing one or more of the problems disclosed in the background section of this application.

Figure 2B:
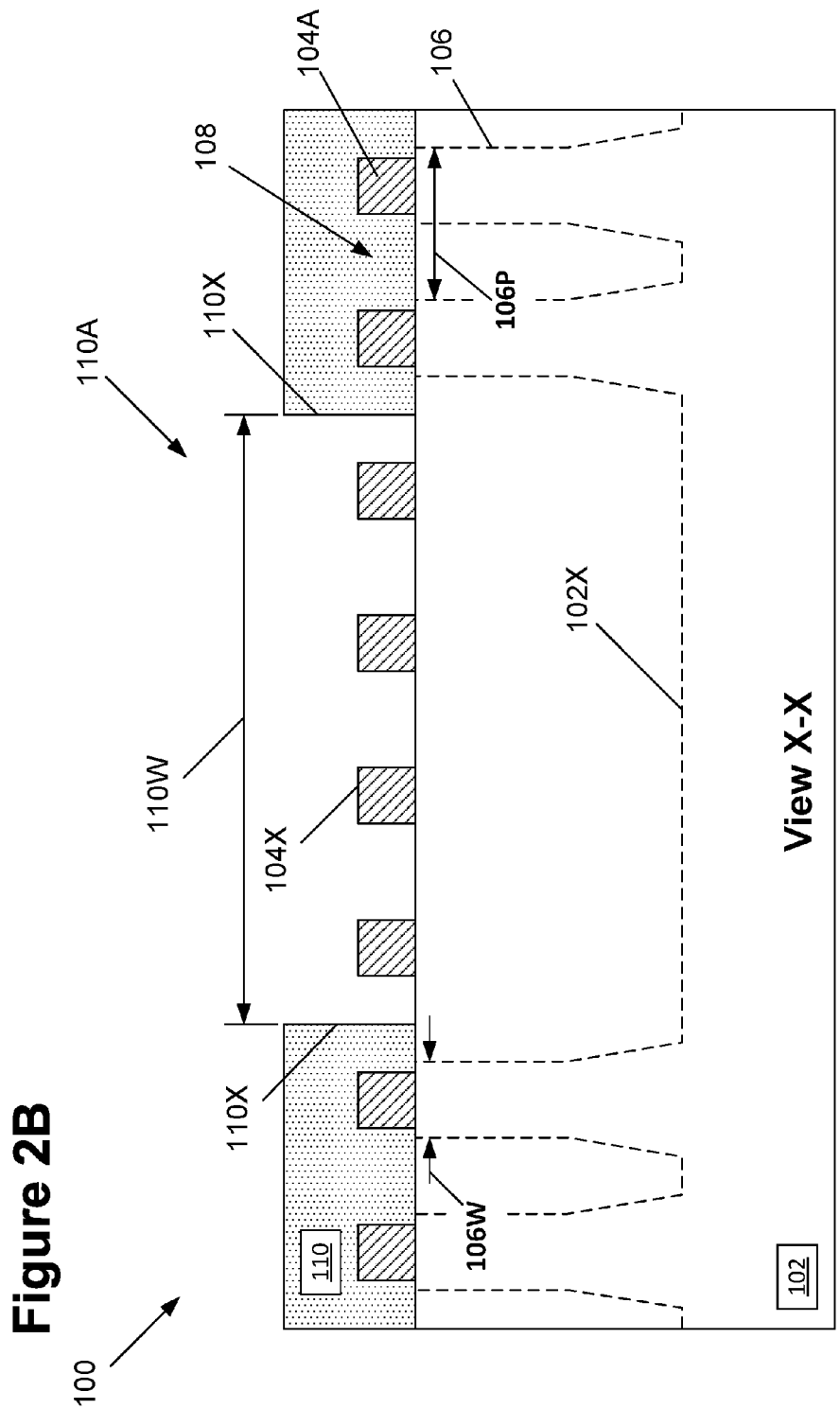
Figure 2C:
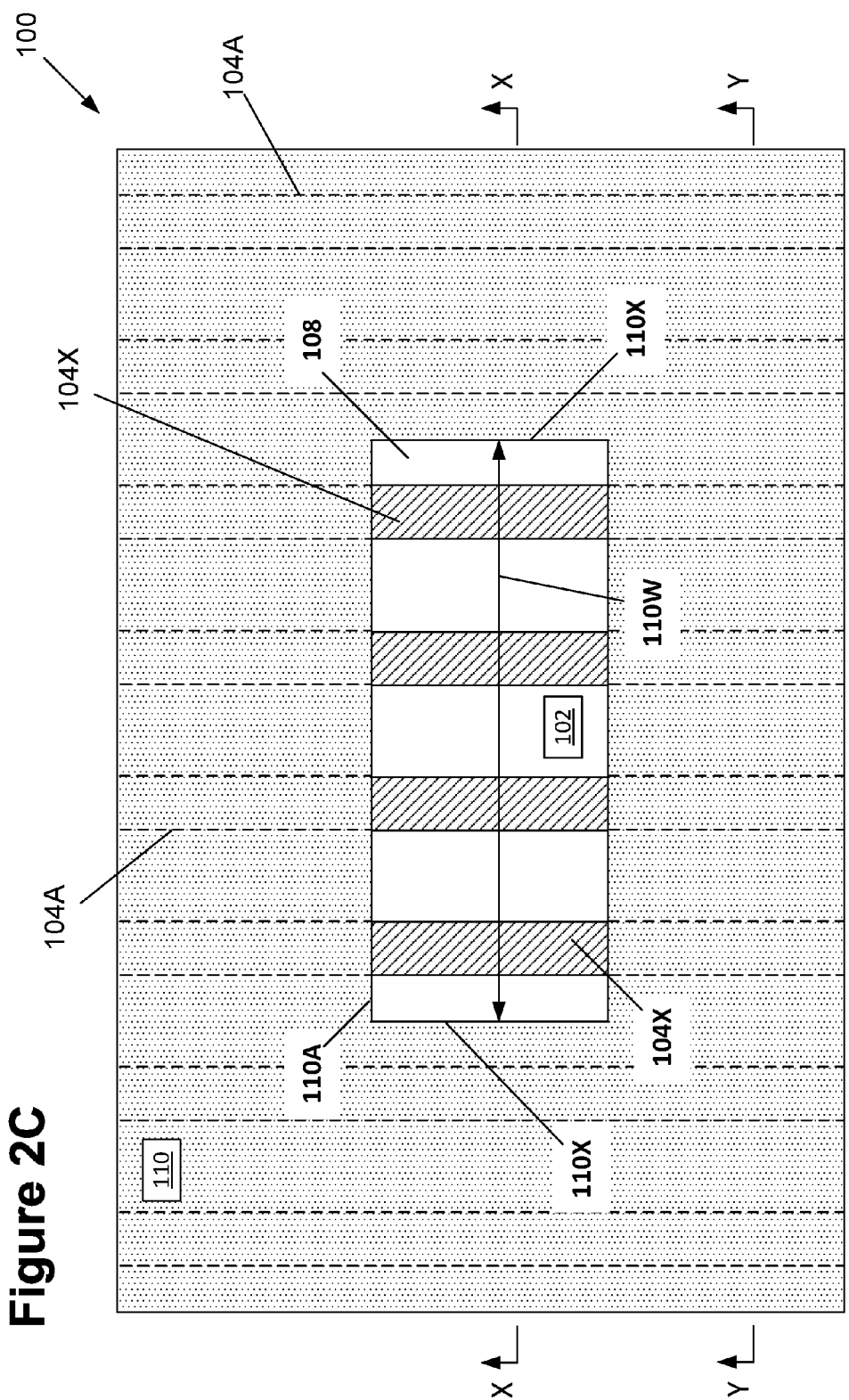

FIGS. 2B-2C depict the device 100 after an illustrative patterned etch mask 110, i.e., a so-called fin-cut mask, was formed above the patterned fin-formation etch mask layer 104 and the substrate 102. FIG. 2C is a plan view that depicts where various cross-sectional views depicted in the drawings are taken. FIG. 2B is a cross-sectional view taken along the line X-X shown in FIG. 2C. The patterned etch mask 110 is intended to be representative in nature in that it may be comprised of one or more layers of any desired materials that may be, in one embodiment, formed using traditional photolithographic tools and techniques. In some cases, the patterned etch mask 110 may represent one or more separately formed and patterned etch masks that are formed above one another so as to collectively define the patterned etch mask 110. Irrespective of the exact manner in which the patterned etch mask 110 is formed, or its materials of construction, the patterned etch mask 110 comprises an opening 110A that exposes portions 104X of four of the line-type features 104A that are to be removed from the initial patterned fin-formation etch mask layer 104 to define a modified fin-formation etch mask layer 104M (with the portions 104X removed), as described more fully below. The opening 110A has a target lateral width 110W and a plurality of edges 110X. Ultimately, as described more fully below, an etching process will be performed through the modified fin-formation hard mask layer 104M to define the fins 106 in the substrate 102 and to define an isolation structure trench 102X in the substrate 102 having a size and position that corresponds approximately to that of the opening 110A.

In the example depicted in the attached drawings, the opening 110A is depicted as being formed precisely to its targeted width 110W and with its edges 110X being perfectly aligned and positioned in the middle of the lateral space 108 between adjacent features 104A. As noted above, using one illustrative numerical example, the lateral space 108 between the features 104A is larger than the lateral spacing 32 between the features 30A discussed in the background section of this application. Accordingly, as will be appreciated by those skilled in the art after a complete reading of the present application, when using the methods disclosed herein as compared to the prior art method discussed previously, the inventive methods disclosed herein provide for a larger tolerance or process window (about +/−9 nm versus about +/−6 nm) as it relates to accurately defining the width 110W of the opening 110A and/or to accurately locating the edges 110X of the opening 110A at some position within the larger spacing 108 between adjacent features 104A.

Figure 2E:
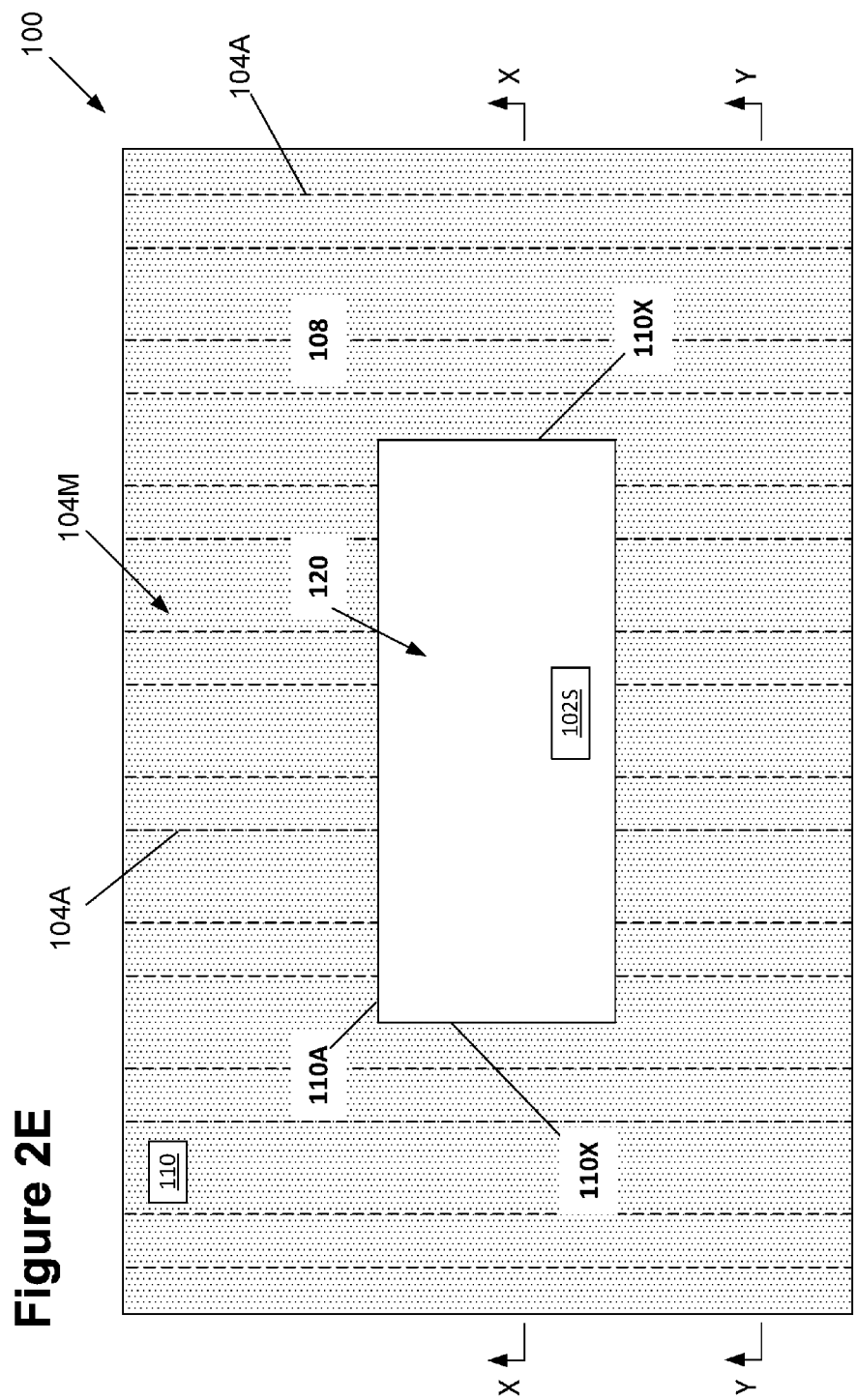

FIGS. 2D-2E depict the device 100 after an etching process, e.g., an anisotropic etching process, was performed through the patterned etch mask 110 to remove the exposed portions 104X of the line-type features 104A exposed by the opening 110A. This operation defines a region 120 on the substrate 102 where the upper surface 102S of the substrate 102 is exposed and results in the definition of a modified fin-formation etch mask layer 104M (with the portions 104X of the line-type features 104A removed).

Figure 2G:
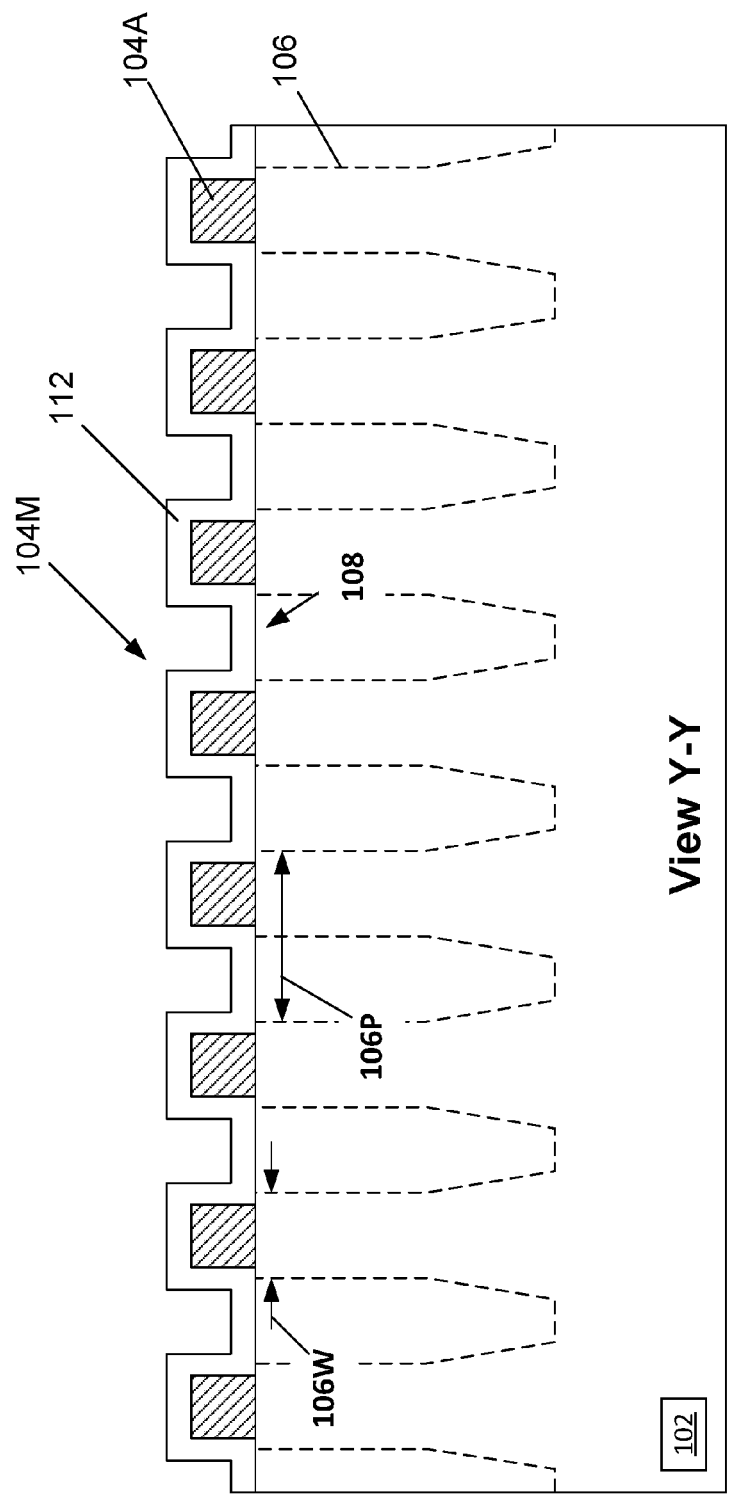

FIG. 2F (view X-X) and FIG. 2G (view Y-Y) depict the device 100 after several process operations were performed. First, the patterned etch mask 110 layer was removed from above the modified fin-formation etch mask layer 104M. Then a conformal deposition process was performed to form a conformal layer 112 on the remaining portions of the line-type features 104A of the modified fin-formation etch mask layer 104M. The conformal layer 112 may be comprised of a variety of different materials, e.g., silicon dioxide, silicon oxynitride, etc., and it may be manufactured by performing, for example, an atomic layer deposition (ALD) process. The thickness of the conformal layer 112 may vary depending upon the particular application and a variety of factors, such as, for example, the lateral width 104W of the features 104A and the target initial width 106W of the fins 106. In one particularly illustrative example, the conformal layer 112 may be a layer of silicon dioxide having a substantially uniform thickness that falls within the range of about 1-10 nm that was formed by performing an ALD process.

FIGS. 2H-2M depict the next major process operation which involves, with the conformal layer 112 in position above the modified fin-formation etch mask layer 104M, performing at least one etching process 122 to define the isolation structure trench 102X and a plurality of fin-formation trenches 102Y in the substrate 102. The at least one etching process 122 may be performed as distinct and separate steps (in one or more etch chambers) or may be different steps that are performed in a back-to-back sequence with appropriate changes in etch chemistry while the substrate 102 remains positioned within a single etch chamber.

Figure 2H:
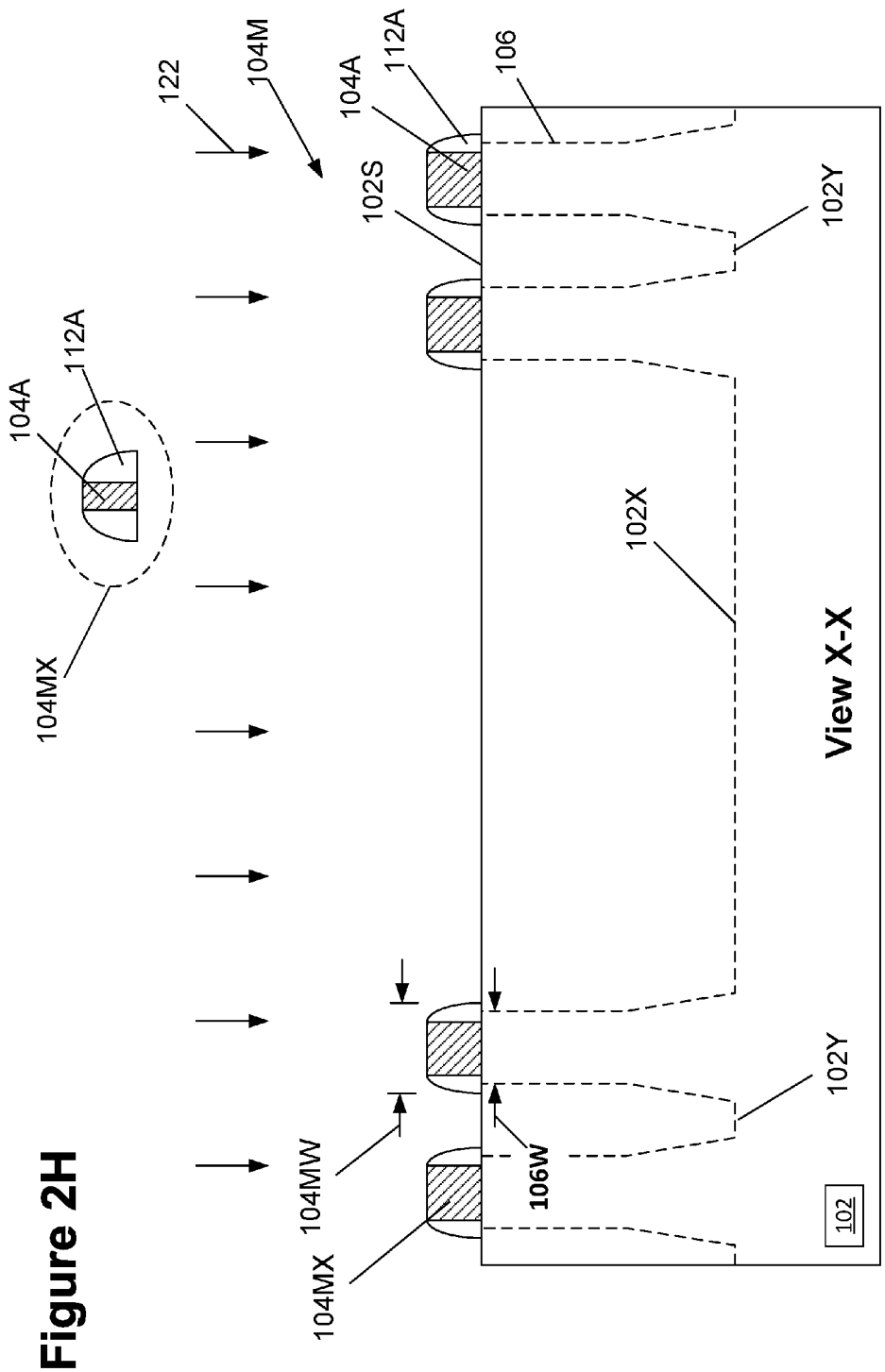

FIG. 2H (view X-X), FIG. 2I (view Y-Y) and FIG. 2J (plan view) depict a point during the at least one etching process 122 wherein an anisotropic etching process was performed with an etch chemistry that selectively removes the conformal layer or material 112 relative to surrounding materials and exposes the upper surface 102S of the substrate 102 for further processing. As depicted, this results in the formation of a spacer-like structure 112A positioned adjacent the remaining original line-type features 104A. The spacer 112A, in combination with the original line-type feature 104A, effectively defines a modified line-type feature 104MX of the modified fin-formation etch mask layer 104M that has a lateral width 104MW that is larger than the lateral width 104W of the original line-type features 104A. For example, continuing with the numerical example above wherein the lateral width 104W may be about 12 nm, the lateral width of the spacer 112A (at its base) may be about 3 nm. As a result, the overall width 104MW of the modified line-type feature 104MX may be about 18 nm (12 nm+3 nm+3 nm)—a width that is targeted to result in the formation of the fins 106 to the targeted lateral width 106W of the fins 106. Also depicted in FIG. 2H in the dashed-line oval is an embodiment of the modified line-type feature 104MX wherein the original line-type feature 104A makes up a smaller portion of the overall width 104MW of the modified line-type feature 104MX and the remaining width 104MW of the modified line-type feature 104MX is formed by forming a relatively thicker conformal layer 112A adjacent the feature 104A.

FIGS. 2K-2M depict the next portion of the at least one etching process 122 wherein a substrate anisotropic etching process was performed with an etch chemistry that selectively removes the exposed portions of the substrate 102 relative to surrounding materials and thereby defines the isolation structure trench 102X and the fin-formation trenches 102Y, which, in turn, define the fins 106. In the example depicted in FIGS. 2K-2L, substantially all of the spacer 112A portion of the features 104MX of the modified fin-formation etch mask layer 104M was consumed during the etching of the substrate 102, however this may not be the case in all situations as some or all of the spacer 112A may remain in position after the formation of the isolation structure trench 102X and the fin-formation trenches 102Y is completed. Such an illustrative situation is depicted in FIG. 2M.

At the point in processing after the isolation structure trench 102X and the fin-formation trenches 102Y are formed so as to define the fins 106, traditional manufacturing operations may be performed to complete the fabrication of such FinFET devices 100. For example, insulating material (not shown) may be formed so as to fill the isolation structure trench 102X and to partially fill the fin-formation trenches 102Y, gate structures may be formed, epi semiconductor material may be formed in the source/drain regions of the devices, contacts may be formed so as to establish electrical connection to the source/drain regions and the gate structure of the FinFET devices, etc.

As will be appreciated by those skilled in the art after a complete reading of the present application, the methods disclosed herein provide, among other things, (1) a means by which the lateral spacing 108 between adjacent line-type features 104A may be made greater, by making the lateral width 104W of the original line type feature 104A in the original patterned fin-formation etch mask 104 relatively smaller, and thereby increasing the process window for forming the fin-cut etch mask 110; and (2) after removing the desired portions 104X of the original line-type features 104A, forming the spacers 112A so as to effectively increase the lateral width of the features of the modified fin-formation etch mask layer 104M that will be used as an etch mask when forming the isolation structure trench 102X and the fin-formation trenches 102Y. By using at least these two mechanisms, the available process window for formation of the fin-cut etch mask layer 110 may be increased while still providing a means to allow device manufacturers to effectively "tune" the final lateral width 104MW of the features 104MX of the modified fin-formation etch mask layer 104M so as to result in the fins 106 having the desired target width 106W at the time they are formed in the substrate 102. In the illustrative example depicted herein, the fin-formation trenches 102Y and the fins 106 are all of a uniform size and shape. However, such uniformity in the size and shape of the fin-formation trenches 102Y and the fins 106 is not required to practice at least some aspects of the inventions disclosed herein. Thus, the size and configuration of the fin-formation trenches 102Y and fins 106 and the manner in which they are made, should not be considered a limitation of the present invention.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming an original fin-formation etch mask above a semiconductor substrate, said original fin-formation etch mask layer comprising a plurality of original line-type features;
    removing at least a portion of at least one of said plurality of original line-type features so as to thereby define a modified fin-formation etch mask comprising remaining portions of said plurality of original line-type features;
    forming a conformal layer of material on said remaining portions of said plurality of original line-type features of said modified fin-formation etch mask; and
    performing at least one etching process to remove at least portions of said conformal layer of material and to define a plurality of fin-formation trenches so as to thereby initially define a plurality of fins in said substrate.

2. The method of claim 1, wherein said removing at least a portion of at least one of said plurality of original line-type features so as to thereby define a modified fin-formation etch mask comprises:
forming a patterned etch mask above said original fin-formation etch mask layer, said patterned etch mask comprising an opening that exposes at least a portion of at least one of said plurality of original line-type features; and
performing an etching process through said opening in said patterned etch mask to remove said exposed portion of said at least one of said plurality of original line-type features.

3. The method of claim 1, wherein said forming said conformal layer of material comprises performing an atomic layer deposition process to form said conformal layer of material.

4. The method of claim 1, wherein performing said at least one etching process to remove at least portions of said conformal layer and to define said plurality of fin-formation trenches comprises performing said at least one etching process such that all of said conformal layer of material is consumed during said at least one etching process.

5. The method of claim 1, wherein performing said at least one etching process to remove at least portions of said conformal layer and to define said plurality of fin-formation trenches comprises performing said at least one etching process such that portions of said conformal layer of material remain positioned adjacent sidewalls of said plurality of original line-type features of said modified fin-formation etch mask after said at least one etching process is completed.

6. The method of claim 1, wherein performing said at least one etching process to remove at least portions of said conformal layer and to define said plurality of fin-formation trenches comprises:
performing a first etching process to remove at least a portion of said conformal layer so as to expose at least a portion of said substrate; and
performing a second etching process to remove at least said exposed portion of said substrate.

7. The method of claim 6, wherein said first etching process is performed in a first etch chamber and said second etching process is performed in a second etch chamber that is different from said first etch chamber.

8. The method of claim 6, wherein said first etching process and said second etching process are performed in back-to-back fashion in a single etch chamber with said substrate being positioned in said single etch chamber during both said first and second etching processes.

9. A method, comprising:
forming an original fin-formation etch mask above a semiconductor substrate, said original fin-formation etch mask layer comprising a plurality of original line-type features, said original line-type features having a first lateral width that is less than a target lateral width at an upper surface of a plurality of fins to be formed in said substrate;
removing at least a portion of at least one of said plurality of original line-type features so as to thereby define a modified fin-formation etch mask comprising remaining portions of said plurality of original line-type features;

performing at least one process operation to add a material to sidewalls of said remaining portions of said plurality of original line-type features of said modified fin-formation etch mask so as to form a plurality of modified line-type features having a second lateral width that is greater than said first lateral width and to expose portions of said substrate; and
after forming said plurality of modified line-type features, performing a substrate etching process through said plurality of modified line-type features to remove at least said exposed portions of said substrate and thereby define a plurality of fin-formation trenches in said substrate that initially define said plurality of fins in said substrate.

10. The method of claim 9, wherein said second lateral width is greater than said target lateral width of said plurality of fins.

11. The method of claim 9, wherein removing at least a portion of at least one of said plurality of original line-type features so as to thereby define said modified fin-formation etch mask comprises:
forming a patterned etch mask above said original fin-formation etch mask layer, said patterned etch mask comprising an opening that exposes at least a portion of at least one of said plurality of original line-type features; and
performing an etching process through said opening in said patterned etch mask to remove said exposed portion of at least one of said plurality of original line-type features.

12. The method of claim 9, wherein performing said at least one process operation to add a material to sidewalls of said remaining portions of said plurality of original line-type features comprises:
depositing a conformal layer of material on and in contact with said plurality of said remaining portions of said modified fin-formation etch mask; and
performing an anisotropic etching process on said conformal layer of material.

13. The method of claim 9, wherein, after completing said substrate etching process through said plurality of modified line-type features, all of said conformal layer of material is consumed during said substrate etching process.

14. The method of claim 9, wherein, after completing said substrate etching process through said plurality of modified line-type features, at least portions of said conformal layer of material remain positioned adjacent sidewalls of said plurality of original line-type features of said modified fin-formation etch mask.

15. The method of claim 9, wherein performing said substrate etching process comprise performing an anisotropic etching process.

16. A method, comprising:
forming an original fin-formation etch mask above a semiconductor substrate, said original fin-formation etch mask layer comprising a plurality of original line-type features, said original line-type features having a first lateral width that is less than a target lateral width at an upper surface of a plurality of fins to be formed in said substrate;
forming a patterned etch mask above said original fin-formation etch mask layer, said patterned etch mask comprising an opening that exposes at least a portion of at least one of said plurality of original line-type features;
performing a first etching process through said opening in said patterned etch mask to remove said exposed portion of at least one of said plurality of original line-type features so as to thereby define a modified fin-formation etch mask comprising remaining portions of said plurality of original line-type features;

depositing a conformal layer of material on and in contact with said plurality of remaining portions of said plurality of original line-type features of said modified fin-formation etch mask;

performing a second anisotropic etching process on said conformal layer such that portions of said conformal layer of material remain positioned adjacent sidewalls of said plurality of original line-type features of said modified fin-formation etch mask after said second anisotropic etching process is completed so as to form a plurality of modified line-type features having a second lateral width that is greater than said first lateral width and to expose portions of said substrate; and after performing said second anisotropic etching process, performing a substrate anisotropic etching process through said plurality of modified line-type features to remove at least said exposed portions of said substrate and thereby define a plurality of fin-formation trenches in said substrate that initially define said plurality of fins in said substrate.

17. The method of claim 16, wherein said second lateral width is greater than said target lateral width of said plurality of fins.

18. The method of claim 16, wherein said second anisotropic etching process and said substrate anisotropic etching process are performed in back-to-back fashion in a single etch chamber with said substrate being positioned in said single etch chamber during both said second anisotropic etching process and said substrate anisotropic etching process.

19. The method of claim 16, wherein, after completing said substrate anisotropic etching, all of said conformal layer of material is consumed during said substrate anisotropic etching process.

20. The method of claim 16, wherein, after completing said substrate anisotropic etching, at least portions of said conformal layer of material remain positioned adjacent sidewalls of said plurality of original line-type features of said modified fin-formation etch mask.

\* \* \* \* \*

UNITED STATES PATENT AND TRADEMARK OFFICE
CERTIFICATE OF CORRECTION

PATENT NO. : 9,754,792 B1  
APPLICATION NO. : 15/056513  
DATED : September 5, 2017  
INVENTOR(S) : Garo Jacques Derderian Page 1 of 1

It is certified that error appears in the above-identified patent and that said Letters Patent is hereby corrected as shown below:

In the Claims

Column 12, Line 40 (Claim 13, Line 1), change "claim 9" to "claim 12".

Column 12, Line 44 (Claim 14, Line 1), change "claim 9" to "claim 12".

Signed and Sealed this
Fourth Day of September, 2018

Andrei Iancu
*Director of the United States Patent and Trademark Office*